(12) United States Patent
Lee et al.

(10) Patent No.: US 11,782,107 B2
(45) Date of Patent: Oct. 10, 2023

(54) ATOMIC MAGNETOMETER AND METHOD OF OPERATING THE SAME

(71) Applicant: Electronics and Telecommunications Research Institute, Daejeon (KR)

(72) Inventors: Hyun Joon Lee, Daejeon (KR); Jang Yeol Kim, Daejeon (KR); Jae Woo Lee, Daejeon (KR); In Kui Cho, Daejeon (KR); Sang Won Kim, Daejeon (KR); Seong Min Kim, Daejeon (KR); Jung Ick Moon, Daejeon (KR); Je Hoon Yun, Daejeon (KR); Dong Won Jang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 74 days.

(21) Appl. No.: 17/538,288

(22) Filed: Nov. 30, 2021

(65) Prior Publication Data
US 2022/0179017 A1   Jun. 9, 2022

(30) Foreign Application Priority Data
Dec. 3, 2020 (KR) .................. 10-2020-0167112

(51) Int. Cl.
*G01R 33/26* (2006.01)
(52) U.S. Cl.
CPC .................. *G01R 33/26* (2013.01)
(58) Field of Classification Search
CPC ...... G01R 33/26; G01R 33/24; G01R 33/032; G01V 3/14; G01N 24/006
See application file for complete search history.

(56) References Cited

U.S. PATENT DOCUMENTS

| | | | |
|---|---|---|---|
| 8,330,334 B2 | 12/2012 | Lee et al. | |
| 9,841,470 B2 | 12/2017 | Hwang et al. | |
| 2008/0106261 A1* | 5/2008 | Romalis | G01R 33/441 324/304 |
| 2011/0025323 A1* | 2/2011 | Budker | G01R 33/26 324/304 |
| 2016/0061913 A1* | 3/2016 | Kobayashi | G01R 33/26 324/305 |
| 2016/0116553 A1 | 4/2016 | Kim et al. | |

FOREIGN PATENT DOCUMENTS

| | | |
|---|---|---|
| KR | 10-1624482 | 5/2016 |
| KR | 10-2020-0113490 | 10/2020 |

\* cited by examiner

*Primary Examiner* — Patrick Assouad
*Assistant Examiner* — Taqi R Nasir
(74) *Attorney, Agent, or Firm* — KILE PARK REED & HOUTTEMAN PLLC

(57) ABSTRACT

An atomic magnetometer, which operates in a communication system using a magnetic signal in a very low frequency (VLF) band, may comprise: a vapor cell comprising one or more alkaline metal atoms; a pump light source configured to provide circularly polarized pump beams to the vapor cell; an irradiation light source configured to provide linearly polarized irradiation beams to the vapor cell; a magnetic signal detecting unit configured to detect a magnetic signal by measuring a polarization rotation angle from the linearly polarized irradiation beam passing through the vapor cell; and a bias magnetic field control unit configured to control a bias magnetic field applied to the vapor cell.

16 Claims, 5 Drawing Sheets

ATOMIC MAGNETOMETER AND METHOD OF OPERATING THE SAME

CROSS-REFERENCE TO RELATED APPLICATIONS

This application claims priority to Korean Patent Application No. 10-2020-0167112, filed on Dec. 3, 2020, filed with the Korean Intellectual Property Office (KIPO), the entire contents of which are hereby incorporated by reference.

BACKGROUND

1. Technical Field

The present disclosure relates to an atomic magnetometer and a method of operating the same, and more particularly, to an atomic magnetometer configured to tune a frequency depending on phase detection feedback and a method of operating the same.

2. Related Art

A communication technology, a so-called magnetic field communication technology, which utilizes a very low frequency (VLF) band, enables communication and position tracking/searching magnetic signal in a situation in which a reduction in signal is distinctly observed. For example, the magnetic field communication technology increases communicability in the ground and the water and between the ground and the water that cannot transmit radio wave-based communication signals. Further, the magnetic field communication technology may extend a communication connection space to the ground, the water, and the air.

An atomic magnetometer refers to a device for measuring a magnetic field depending on an interaction between light in the magnetic field and atoms that resonate the light. The atomic magnetometer having higher sensitivity has a narrower frequency band. Meanwhile, the wireless communication generally performs a modulation process that converts a baseband signal into a high-frequency passband signal. The modulation method requires a wide frequency bandwidth.

Therefore, in a magnetic signal-based magnetic field communication technology in the VLF band, a bandwidth needs to be extended to utilize the atomic magnetometer as a magnetic receiver. Because the frequency bandwidth of the atomic magnetometer and the magnetic sensitivity are in a trade-off relationship, there is a need for a technology to extend the frequency bandwidth while reducing the sacrifice of the magnetic sensitivity.

SUMMARY

The present disclosure has been made in an effort to provide an atomic magnetometer that operates in a communication system that uses a magnetic signal in a VLF band.

The present disclosure has also been made in an effort to provide a method of operating an atomic magnetometer.

According to an exemplary embodiment of the present disclosure for achieving the above-described objective, an atomic magnetometer, which operates in a communication system using a magnetic signal in a very low frequency (VLF) band, may comprise: a vapor cell comprising one or more alkaline metal atoms; a pump light source configured to provide circularly polarized pump beams to the vapor cell; an irradiation light source configured to provide linearly polarized irradiation beams to the vapor cell; a magnetic signal detecting unit configured to detect a magnetic signal by measuring a polarization rotation angle from the linearly polarized irradiation beam passing through the vapor cell; and a bias magnetic field control unit configured to control a bias magnetic field applied to the vapor cell.

The vapor cell may further comprise: a buffer gas configured to reduce a proportion of the alkaline metal atoms which are diffused to a wall of the vapor cell; and a quenching gas configured to improve optical pumping efficiency.

A direction of the bias magnetic field may be parallel to a direction of magnetic polarization formed when the alkaline metal atom is optically pumped by the pump light.

The bias magnetic field control unit may form the magnetic field by providing different currents to a plurality of coils depending on a phase signal detected from the magnetic signal.

The magnetic signal detecting unit may measure a polarization rotation angle of the atomic magnetometer using a balanced polarimeter.

The atomic magnetometer may further comprise: a phase detection unit configured to detect a phase signal of the magnetic field from the detected magnetic signal.

The phase detection unit may comprise: a frequency mixer configured to generate a difference between the magnetic signal and a reference signal or a sum signal of the magnetic signal and the reference signal by mixing the inputted magnetic signal and the reference signal; a low-pass filter configured to filter out a predetermined frequency from the difference between the magnetic signal and the reference signal or the sum signal; an analyzer configured to calculate a phase and a size of a vector of the filtered signal; and a digital-to-analog converter (DAC) configured to output two voltages as an analog value depending on an analysis result of the analyzer.

The vapor cell may be positioned in a temperature adjusting device configured to adjust a temperature of the vapor cell.

The temperature adjusting device may have an oven structure, and the oven structure may adjust a vapor pressure of the alkaline metal atom in the vapor cell by circulating air or a liquid.

The oven structure may comprise a heating unit configured to heat the vapor cell.

The atomic magnetometer may further comprise: a magnetic shielding means configured to shield the magnetic field of the vapor cell.

According to another exemplary embodiment of the present disclosure for achieving the above-described objective, a method of operating an atomic magnetometer, which operates in a communication system using a magnetic signal in a very low frequency (VLF) band, may comprise: providing circularly polarized pump beams and linearly polarized irradiation beams to a vapor cell under a magnetic field generated by an antenna; detecting a magnetic signal by measuring a polarization rotation angle from the linearly polarized irradiation beam passing through the vapor cell; detecting a phase signal of the magnetic field from the detected magnetic signal; and controlling a bias magnetic field applied to the vapor cell depending on the detected phase signal of the magnetic field.

The vapor cell may comprise: one or more alkaline metal atoms; and a buffer gas configured to reduce a proportion of the alkaline metal atoms which are diffused to a wall of the vapor cell.

A direction of the bias magnetic field may be parallel to a direction of magnetic polarization formed when the alkaline metal atom is optically pumped by the pump light.

The controlling of the bias magnetic field may comprise forming the magnetic field by providing different currents to a plurality of coils depending on the detected phase signal.

The detecting of the magnetic signal may comprise measuring a polarization rotation angle of the atomic magnetometer using a balanced polarimeter.

The detecting of the phase signal of the magnetic field may comprise: generating a difference between the magnetic signal and a reference signal or a sum signal of the magnetic signal and the reference signal by mixing the inputted magnetic signal and the reference signal; filtering out a particular frequency from the difference between the magnetic signal and the reference signal or the sum signal using a low-pass filter; analyzing a phase and a size of a vector of the filtered signal; and outputting two voltage values as the phase signal depending on an analysis result.

The vapor cell may further comprise a quenching gas configured to improve optical pumping efficiency.

According to the embodiment of the present disclosure described above, it is possible to effectively extend the frequency bandwidth while reducing the sacrifice of the magnetic sensitivity of the atomic magnetometer.

Therefore, in the magnetic signal-based magnetic field communication technology in the VLF band, the atomic magnetometer according to the present disclosure may be efficiently used as the magnetic receiver.

DETAILED DESCRIPTION OF THE EMBODIMENTS

Figure 1:
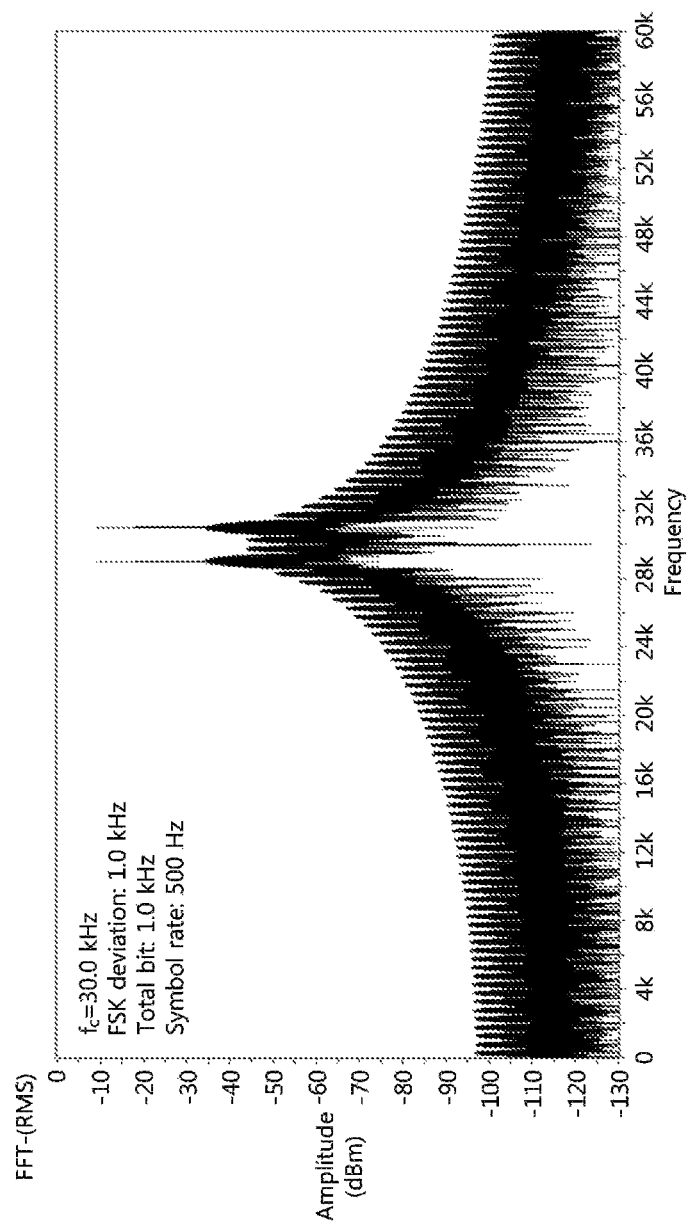
FIG. 1 is a graph illustrating an example of a power spectrum of an FSK modulation signal.

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings.

The basic principle of an atomic magnetometer or an optically pumped magnetometer for measuring a magnetic field depending on an interaction light and atoms that resonate the light is to measure a Larmor precession frequency related to the spin of the electron or core in the magnetic field. Specifically, when the spin of the atom aligned with a specific direction (quantum axis direction) is changed to another direction by an external magnetic field, the atomic magnetometer measures the amount of change, thereby measuring the magnetic field.

The radio frequency atomic magnetometer (REAM) measures a magnetic signal, as a magnetic resonance phenomenon, having the same frequency as the Larmor frequency of the atom in a bias magnetic field. The magnetization of the atom is formed in a quantum axis (z-axis) by pump light described below. At the same time, the bias magnetic field is applied in the z-axis direction to set the Larmor precession frequency corresponding to an energy difference at a Zeeman magnetic sublevel. When the external magnetic signal having the frequency equal to the Larmor frequency is applied in a direction perpendicular to the z-axis, the atom spin (magnetization) spirally rotates outward about the z-axis by the magnetic resonance phenomenon at the Zeeman magnetic sublevel. This induces a spin component rotating coherently (with the same phase) with the Larmor frequency on an x-y plane. This may be understood as a change in phase of magnetization generated by the magnetic resonance. This change causes a change in density between energy states of the atom and results in the rotation of the polarized irradiation light in proportion to the magnetic field. Therefore, the radio frequency atomic magnetometer may observe a change in magnetic field by measuring a degree of polarization rotation of the irradiation light.

The measuring frequency of the radio frequency atomic magnetometer is determined by Zeeman splitting and hyperfine splitting, and this value mainly reaches several kilohertz (kHz) to several megahertz (MHz). This RF frequency band is not affected by vibration noise or power noise in a relatively low-frequency band. A typical noise level of the RF atomic magnetometer reaches several $pT/Hz^{1/2}$ to several $fT/Hz^{1/2}$. Therefore, this is appropriate to develop and apply the magnetic field communication technology using the magnetic field in the corresponding frequency band.

In the development of the communication technology using the magnetic field, the frequency bandwidth in the magnetic field used for the magnetic signal may be a low-frequency signal of several to several tens of kilohertz (kHz). The magnetic field in the VLF band has dipolar characteristics, and transmission strength decreases by a value made by multiplying the distance three times. Therefore, the measuring range for the signal rapidly decreases depending on the distance. Therefore, a very sensitive magnetic sensor such as an atomic magnetometer is required.

The magnetic noise level or the magnetic sensitivity of the atomic magnetometer is inversely proportional to alignment maintaining time (magnetization maintaining time or coherent time) of the atom spin. In addition, Equation $$\delta B \sim \frac{\Gamma}{SNR}$$

related to the magnetic sensitivity may be established. Where, $\Gamma$ represents a line width with of a signal based on a frequency, and SNR represents a ratio of noise to signal. Therefore, when the reaction to the external magnetic field is expressed as a function of frequency, the atomic magnetometer with high sensitivity (low noise level) necessarily has a narrow frequency bandwidth because the sensitivity and the line width of the signal are in the trade-off relationship. As described above, the magnetic sensitivity and the frequency bandwidth of the atomic magnetometer are in the trade-off relationship.

In addition, because the recent wireless communication includes a modulation process of converting a digital baseband signal into a high-frequency passband signal to transmit data, the wireless communication requires a wide frequency bandwidth. In the magnetic field communication technology for transmitting the magnetic data in the VLF band, there is a need for a technology capable of extending the bandwidth while minimizing deterioration in magnetic sensitivity in order to use the atomic magnetometer as a data receiver.

Therefore, the present disclosure is intended to provide a method of actively tuning an operating frequency of the magnetometer in accordance with the frequency of the magnetic data to be measured by phase detection and feedback of an output signal of the atomic magnetometer when the frequency component is intended to receive various magnetic data (e.g., frequency-shift keying).

To this end, the present disclosure may use the phase detection and feedback method to effectively extend the frequency bandwidth of the atomic magnetometer without the meaningful sacrifice of sensitivity.

The phase detection and feedback method according to the present disclosure analyzes the magnetic signal, measured by the atomic magnetometer, using a device, such as lock-in-amp, having a sensitive phase detector or a similar function. An output voltage $U_{out}(t)$ of the phase detection unit may be expressed as the following Equation 1 based on a signal $U_{in}(s)$ inputted from the atomic magnetometer and a reference frequency $f_{ref}$ set by the phase detection unit.

$$U_{out}(t) = \frac{1}{T}\int_{t-T}^{t} \sin[2\pi f_{ref} \cdot s + \varphi]U_{in}(s)ds \qquad \text{[Equation 1]}$$

In Expression 1, $\varphi$ represents a phase set by the phase detection unit. If the measurement time T is sufficiently larger than a cycle of a measured signal, the output may be expressed by the following Equation 2.

$$U_{out} = \frac{1}{2}V_{sig}\cos\theta \qquad \text{[Equation 2]}$$

In this case, $V_{sig}$ represents a signal with the reference frequency, $\theta$ represents a phase difference between an input signal and a reference signal. Therefore, to measure a magnetic signal including two different frequency components, it is possible to determine the voltage of the output signal of the phase detection unit depending on the frequency of the input signal.

The output voltage set as described above is inputted to a bias magnetic field control unit of the atomic magnetometer, and a pulse with a particular voltage may be generated depending on the input voltage, thereby tuning the active frequency of the atomic magnetometer.

For example, when a frequency shift keying (FSK) method of modulating a digital signal using a frequency difference of an analog signal is used, the bias magnetic field may be controlled to operate the atomic magnetometer with the Larmor frequency corresponding to the two frequencies $f_1$ and $f_2$. However, in the case of the modulation of the FSK method, all the frequency components are included between the two frequencies as well as the components of $f_1$ and $f_2$ because of non-continuity between the two signals, which causes an increase in line width.

FIG. 1 is a graph illustrating an example of a power spectrum of an FSK modulation signal.

FIG. 1 illustrates a power spectrum of a modulation signal when $f_c$=30.0 kHz and a difference between $f_1$ and $f_2$ is 1.0 kHz. As described above, various components from $f_1$ to $f_2$ are included.

Figure 2:
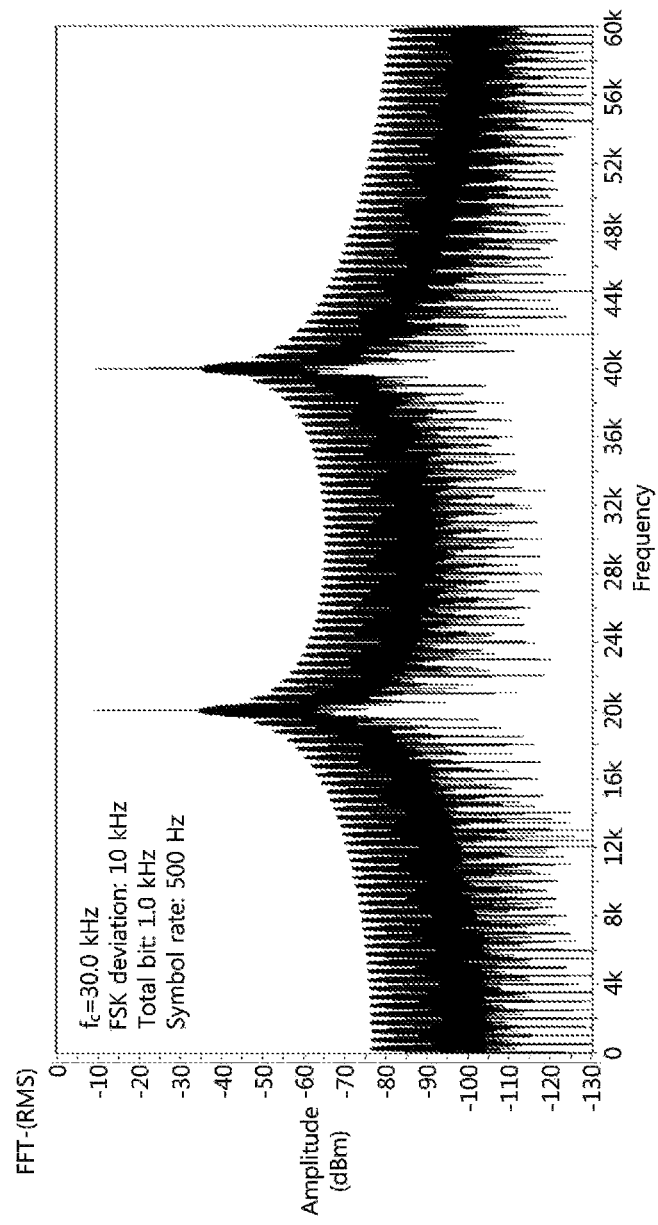
FIG. 2 is a graph illustrating another example of the power spectrum of the FSK modulation signal.

FIG. 2 is a graph illustrating another example of the power spectrum of the FSK modulation signal.

FIG. 2 illustrates a power spectrum of a modulation signal when $f_c$=30.0 kHz and a difference between $f_1$ and $f_2$ is 10.0 kHz. It can be seen that the expansion of the bandwidth of the signal is decreased unlike the case illustrated in FIG. 1. This means that there is no distinct expansion of the bandwidth when the frequency difference between the modulation signal and the carrier frequency in the VLF band is small.

In general, when the sensitivity of the radio frequency atomic magnetometer is several $pT/Hz^{1/2}$ to $fT/Hz^{1/2}$, the line width reaches approximately several tens of hertz (Hz) to several kilohertz (kHz). This value may be converted into the time of approximately several hundreds of microseconds (μs) to several hundreds of milliseconds (ms). That is, a delay of the reaction may occur when measuring the signal having different frequencies $f_1$ and $f_2$ because of the phase of the atom spin or the time of change in state of the magnetization. Further, a delay of the reaction may also occur depending on characteristics of constitute devices or elements of the phase detection unit. In consideration of the above-mentioned points, a symbol rate may be set to be equal to or larger than a delay time of the signal in order to apply the phase detection and feedback method to the atomic magnetometer.

Figure 3:
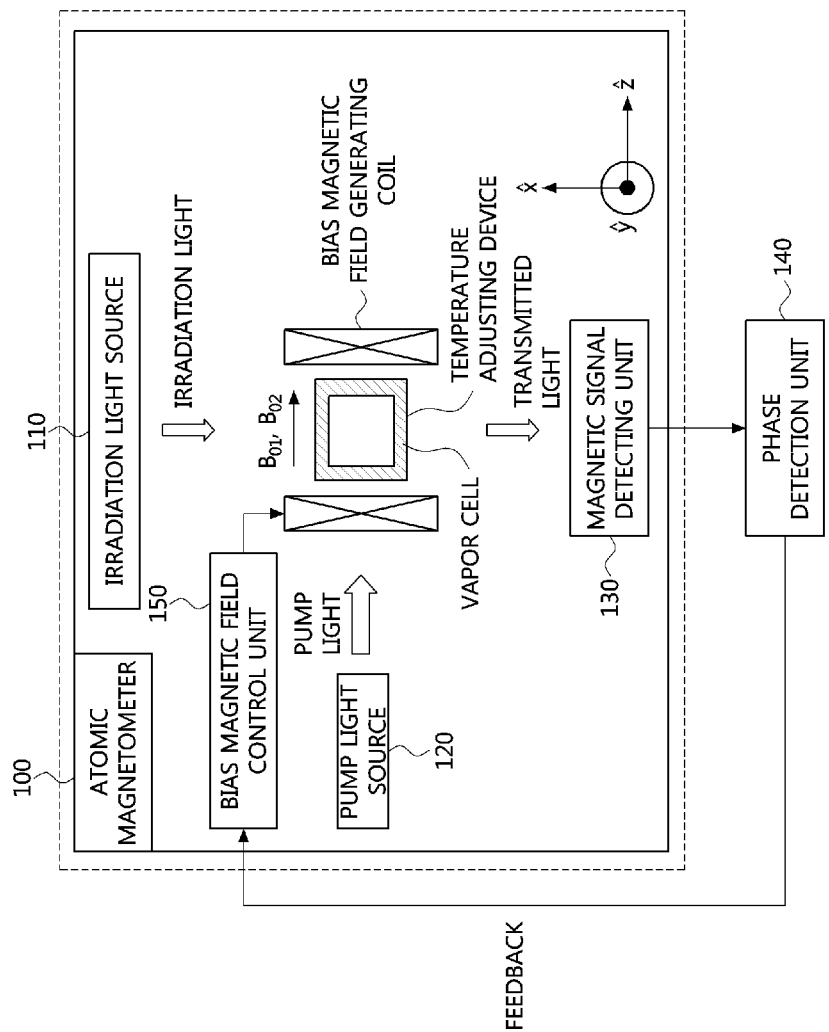
FIG. 3 is a block configuration view of the atomic magnetometer according to the embodiment of the present disclosure.

FIG. 3 is a block configuration view of the atomic magnetometer according to the embodiment of the present disclosure.

The atomic magnetometer according to the embodiment of the present disclosure illustrated in FIG. 3 is a radio frequency atomic magnetometer capable of autonomously tuning the frequency depending on the phase detection feedback.

In FIG. 3, a phase detection unit 140 is illustrated as a separate constituent element, but an atomic magnetometer 100 may include the phase detection unit 140.

The atomic magnetometer 100 may include a vapor cell including alkaline metal atoms, and a temperature adjusting device. In addition, the atomic magnetometer 100 may include an irradiation light source 110, a pump light source 120, a magnetic signal detecting unit 130, and a bias magnetic field control unit 150.

The vapor cell may include alkaline metal atoms and a buffer gas. In this case, the alkaline metal atoms may include potassium (K), rubidium (Rb), cesium (Cs), and the like. Examples of the buffer gas may include inert gas such as helium or xenon, and nitrogen gas or the like may be used as a quenching gas. The buffer gas reduces a proportion of the atoms which are diffused to a wall. The quenching gas efficiency increases optical pumping.

The vapor cell receives circularly polarized pump beams and linearly polarized irradiation beams to be described below.

The vapor cell may be positioned in the temperature adjusting device having an oven structure. The oven structure serves to adjust a temperature of the vapor cell including the alkaline metal atoms. The oven structure may adjust a vapor pressure of the alkaline metal atoms by transferring heat, circulating hot air, or circulating a hot liquid.

The oven structure may include a heating unit that heats the vapor cell. The vapor cell may be heated to 40° C. to 200° C. depending on types of alkaline metal atoms. The heating unit has a shape in which a copper pattern resistive element is etched on Kapton. A temperature adjusting method generates heat by applying alternating current of 100 kHz to 1.0 MHz to the resistive element. Because an induced magnetic field is generated by the alternating current of the temperature adjusting device, a frequency band maximally departing from the operating frequency of the atomic magnetometer may be selected to minimize the influence of the induced magnetic field. A heating method using an alternating current resistance wire may innovatively reduce a space in comparison with a temperature adjusting method using a heating fluid in the related art.

A heating body may automatically maintain a predetermined temperature through feedback control. The heating unit may be thermally insulated by a thermal insulating panel.

In addition, the atomic magnetometer includes the pump light source 120 and the irradiation light source 110. The pump light source may output pump light. In this case, the pump light source may include an external cavity diode laser (ECDL). The pump light source 120 optically pumps the alkaline metal atoms included in the vapor cell by outputting the pump light to the vapor cell. In this case, circularly polarized light may be used as the pump beams outputted from the pump light source. In this case, the pump light source may transmit the circularly polarized pump beams to the vapor cell through polarization maintaining fibers of a single mode TEM00. A wavelength of the pump light is coincident with a center of a D1 or D2 line of the alkaline metal atom. Specifically, the line with high pumping efficiency is selected to fix the frequency. The pump light may propagate in the z-axis direction illustrated in FIG. 3.

When the predetermined pump light is emitted, the vapor of the alkaline metal atoms in the vapor cell absorbs the circularly polarized light with the particular wavelength on the basis of the quantum-mechanical selection rule. The alkaline metal atoms are concentrated in one energy state by continuous absorption and reradiation. That is, the alkaline metal atoms in the vapor cell are optically pumped to form atom magnetization in a quantum axis identical to a direction in which the pump light propagates. A direction of the magnetic polarization is the z-axis direction illustrated in FIG. 3.

Meanwhile, the irradiation light source 110 of the atomic magnetometer may output the irradiation light. The irradiation light may include an external cavity diode laser. In this case, a wavelength of the irradiation light may be monitored by a saturated absorption spectroscopic device and a light wavelength measurer. In this case, linearly polarized light may be used as the irradiation light outputted from the irradiation light source. The linearly polarized irradiation light propagates in an x-axis direction illustrated in FIG. 3 and then is provided to the vapor cell. The wavelength of the irradiation beam needs to depart by about several gigahertz GHz from the D1 or D2 line of the alkaline metal atoms in order to minimize the absorption. This is to prevent the spin state of the atom formed by the pump light from being changed by the absorption of the irradiation light.

The irradiation light source may transmit the linearly polarized irradiation beam to the vapor cell through the polarization maintaining fibers of the single mode TEM00. A ½ wave plate may change a direction of the linearly polarized light. The irradiation beam having passed through the ½ wave plate may be provided to the vapor cell in the x-axis direction. The irradiation beam passes through the vapor cell (transmitted light in FIG. 3) and then is provided to the magnetic signal detecting unit 130.

Meanwhile, in FIG. 3, the bias magnetic field control unit 150 supplies current to a bias magnetic field generating coil. The bias magnetic field control unit 150 applies predetermined bias magnetic fields $B_{01}$, $B_{02}$ to the cell through the bias magnetic field generating coil. The direction of the bias magnetic field is parallel to the magnetic polarization direction of the alkaline metal atoms.

The bias magnetic field generating coil may include a plurality of coil parts capable of forming a uniform magnetic field. For example, a Helmholtz coil may be used. The alkaline metal atom included in the vapor cell performs a precession motion about the z-axis by means of the bias magnetic field. In this case, an angular frequency of the precession motion is $\gamma B_0$. $\gamma$ is a gyromagnetic ratio of the alkaline metal atom. The bias magnetic field control unit may be set to generate different currents depending on the voltage supplied from the phase detection unit to be described below.

The magnetic signal detecting unit 130 may measure a polarization rotation angle of the atomic magnetometer and use a balanced polarimeter to this end. The balanced polarimeter may include a polarized beam splitter, a first photodiode, a second photodiode, and a differential amplifier. The polarized beam splitter may be a Wollaston prism that splits the beam depending on the polarized state. An output of the first photodiode and an output of the second photodiode are provided to the differential amplifier. Therefore, the output of the differential amplifier is proportional to a polarization rotation angle.

Figure 4:
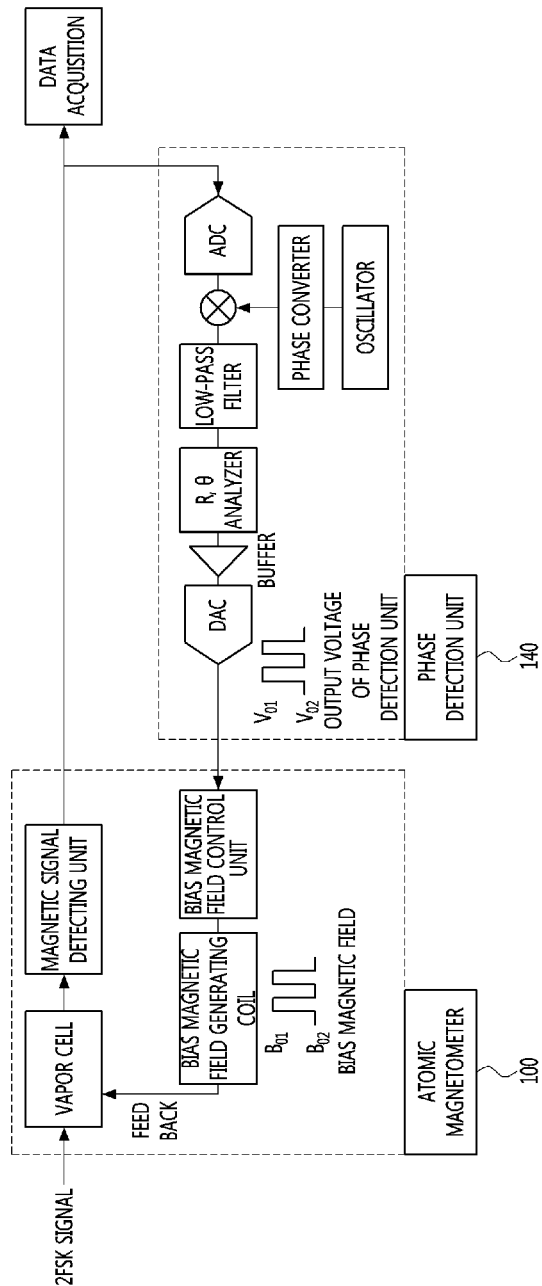
FIG. 4 is a block configuration view of the phase detection unit according to the embodiment of the present disclosure.

FIG. 4 is a block configuration view of the phase detection unit according to the embodiment of the present disclosure.

The phase detection unit 140 according to the embodiment of the present disclosure detects a phase of an analog signal supplied from the magnetic signal detecting unit 130 of the atomic magnetometer 100. In the embodiment illustrated in FIG. 4, the phase detection unit is illustrated as a constituent element separated from the atomic magnetometer. However, as described above, the atomic magnetometer may include the phase detection unit.

The phase detection unit may include an oscillator for generating a reference signal, a phase converter for controlling a phase of the reference signal, an analog-to-digital converter (ADC), a mixer, a low-pass filter, an R, θ analyzer, a buffer, and a DAC.

The analog signal supplied from the magnetic signal detecting unit may be converted into a digital signal by the ADC. The reference signal and the converted digital signal are provided to the frequency mixer. The frequency mixer may generate a frequency difference between the converted signal and the reference signal or a sum signal of the converted signal and the reference signal. In addition, the low-pass filter including a resistor-capacitor (RC) filter, a finite impulse response (FIR) filter, and an infinite impulse response (IIR) filter filters out a particular frequency. This signal is inputted to the R, θ analyzer, and the analyzer analyzes a phase and a size of a vector of the filtered input signal. The signal having passed through the buffer is supplied to the digital-to-analog converter (DAC) and converted into the analog signal. Finally, the value of the converted analog signal may be inputted to the bias magnetic field control unit 150 of the atomic magnetometer.

The phase detection unit outputs two types of voltages $V_{O1}$ or $V_{O2}$ to the signal having the two different frequency components. The bias magnetic field control unit determines an operating frequency of the atomic magnetometer by generating two currents depending on the two voltages.

Meanwhile, the atomic magnetometer according to the present disclosure may further include a magnetic shielding means (not illustrated). The magnetic shielding means may be a passive magnetic shielding means having a soft-magnetic element such as mu-metal or an active magnetic shielding means including an assembly of coils.

The passive magnetic shielding means may be configured as a magnetic element disposed around the vapor cell and configured to reduce the external environment magnetic field. The magnetic shielding means may include a multi-layered cylindrical mu-metal chamber that surrounds the vapor cell. The mu-metal may be a nickel-iron alloy. In this case, the mu-metal chamber minimizes the effect of the external magnetic field including the Earth's magnetic field.

The magnetic shielding means may be disposed to surround the vapor cell, the heating unit disposed to surround the vapor cell, a magnetic field compensation coil disposed to surround the heating unit, and the bias magnetic field generating coil. A magnetic field compensation part may be disposed around the vapor cell and generate a compensation magnetic field to remove the external environment magnetic field or the residual magnetic field remaining after being removed by the magnetic shielding means.

Meanwhile, an active magnetic shielding technique may be applied to the active magnetic shielding means. The magnetic field compensation part may be disposed around the vapor cell and generate the compensation magnetic field to remove the external environment magnetic field or the residual magnetic field remaining after being removed by the magnetic shielding part.

Figure 5:
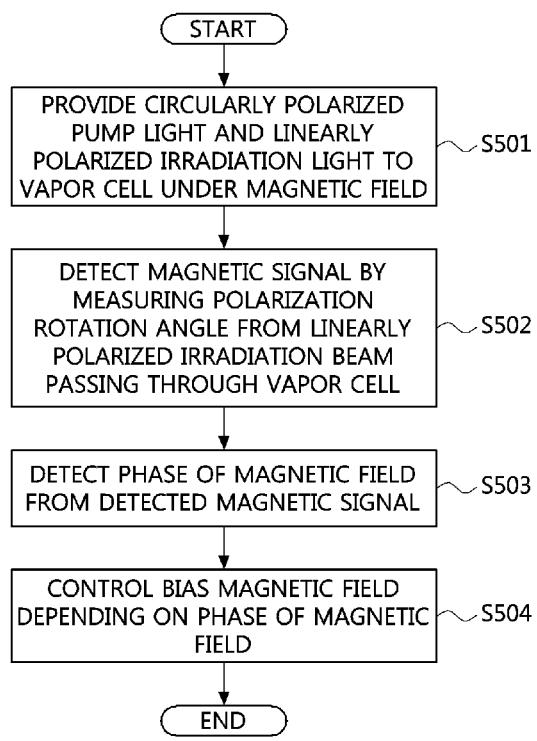
FIG. 5 is a flowchart illustrating a method of operating the atomic magnetometer according to the embodiment of the present disclosure.

FIG. 5 is a flowchart illustrating a method of operating the atomic magnetometer according to the embodiment of the present disclosure.

The method of operating the atomic magnetometer illustrated in FIG. 5 may be performed by the atomic magnetometer described with reference to the above-mentioned embodiments or by both the atomic magnetometer and the phase detection unit, but the operating subject is not limited to thereto.

First, the atomic magnetometer provides the circularly polarized pump light and the linearly polarized irradiation light to the vapor cell including alkaline metal vapor under a magnetic field in the VLF band generated by an antenna (S501). Thereafter, the magnetic signal is detected by measuring the polarization rotation angle from the linearly polarized irradiation beam having passed through the vapor cell (S502). In addition, the phase of the magnetic field is detected from the detected magnetic signal (S503).

The detected phase signal of the magnetic field may be provided as feedback by controlling the bias magnetic field and used to control the bias magnetic field applied to the vapor cell of the atomic magnetometer (S504).

The embodiments of the present disclosure have been described above, focusing on the radio frequency atomic magnetometer and the method of operating the same. However, the present disclosure may also be applied to the optically pumped magnetometer.

The operations of the method according to the exemplary embodiment of the present disclosure can be implemented as a computer readable program or code in a computer readable recording medium. The computer readable recording medium may include all kinds of recording apparatus for storing data which can be read by a computer system. Furthermore, the computer readable recording medium may store and execute programs or codes which can be distributed in computer systems connected through a network and read through computers in a distributed manner.

The computer readable recording medium may include a hardware apparatus which is specifically configured to store and execute a program command, such as a ROM, RAM or flash memory. The program command may include not only machine language codes created by a compiler, but also high-level language codes which can be executed by a computer using an interpreter.

Although some aspects of the present disclosure have been described in the context of the apparatus, the aspects may indicate the corresponding descriptions according to the method, and the blocks or apparatus may correspond to the steps of the method or the features of the steps. Similarly, the aspects described in the context of the method may be expressed as the features of the corresponding blocks or items or the corresponding apparatus. Some or all of the steps of the method may be executed by (or using) a hardware apparatus such as a microprocessor, a programmable computer or an electronic circuit. In some embodiments, one or more of the most important steps of the method may be executed by such an apparatus.

Although the present disclosure has been described with reference to preferred embodiments, it will be apparent to those skilled in the art that the present disclosure may be variously changed and modified without departing from the spirit and scope of the invention defined in the following claims.

What is claimed is:

1. An atomic magnetometer, which operates in a communication system using a magnetic signal in a very low frequency (VLF) band, the atomic magnetometer comprising:
a vapor cell comprising one or more alkaline metal atoms;
a pump light source configured to provide circularly polarized pump beams to the vapor cell;
an irradiation light source configured to provide linearly polarized irradiation beams to the vapor cell;
a magnetic signal detecting unit configured to detect a magnetic signal by measuring a polarization rotation angle from the linearly polarized irradiation beam passing through the vapor cell; and
a bias magnetic field control unit configured to control a bias magnetic field applied to the vapor cell,
wherein the bias magnetic field control unit forms the magnetic field by providing different currents to a plurality of coils depending on a phase signal detected from the magnetic signal.

2. The atomic magnetometer of claim 1, wherein the vapor cell further comprises:
a buffer gas configured to reduce a proportion of the alkaline metal atoms which are diffused to a wall of the vapor cell; and
a quenching gas configured to improve optical pumping efficiency.

3. The atomic magnetometer of claim 1, wherein a direction of the bias magnetic field is parallel to a direction of magnetic polarization formed when the alkaline metal atom is optically pumped by the pump light.

4. The atomic magnetometer of claim 1, wherein the magnetic signal detecting unit measures a polarization rotation angle of the atomic magnetometer using a balanced polarimeter.

5. The atomic magnetometer of claim 1, further comprising:
a phase detection unit configured to detect a phase signal of the magnetic field from the detected magnetic signal.

6. The atomic magnetometer of claim 1, wherein the phase detection unit comprises:
a frequency mixer configured to generate a difference between the magnetic signal and a reference signal or a sum signal of the magnetic signal and the reference signal by mixing the inputted magnetic signal and the reference signal;
a low-pass filter configured to filter out a predetermined frequency from the difference between the magnetic signal and the reference signal or the sum signal;
an analyzer configured to calculate a phase and a size of a vector of the filtered signal; and
a digital-to-analog converter (DAC) configured to output two voltages as an analog value depending on an analysis result of the analyzer.

7. The atomic magnetometer of claim 1, wherein the vapor cell is positioned in a temperature adjusting device configured to adjust a temperature of the vapor cell.

8. The atomic magnetometer of claim 7, wherein the temperature adjusting device has an oven structure, and the oven structure adjusts a vapor pressure of the alkaline metal atom in the vapor cell by circulating air or a liquid.

9. The atomic magnetometer of claim 8, wherein the oven structure comprises a heating unit configured to heat the vapor cell.

10. The atomic magnetometer of claim 1, further comprising:
a magnetic shielding means configured to shield the magnetic field of the vapor cell.

11. A method of operating an atomic magnetometer, which operates in a communication system using a magnetic signal in a very low frequency (VLF) band, the method comprising:
providing circularly polarized pump beams and linearly polarized irradiation beams to a vapor cell under a magnetic field generated by an antenna;
detecting a magnetic signal by measuring a polarization rotation angle from the linearly polarized irradiation beam passing through the vapor cell;
detecting a phase signal of the magnetic field from the detected magnetic signal; and
controlling a bias magnetic field applied to the vapor cell depending on the detected phase signal of the magnetic field,
wherein the controlling of the bias magnetic field comprises forming the magnetic field by providing different currents to a plurality of coils depending on the detected phase signal.

12. The method of claim 11, wherein the vapor cell comprises:
one or more alkaline metal atoms; and
a buffer gas configured to reduce a proportion of the alkaline metal atoms which are diffused to a wall of the vapor cell.

13. The method of claim 11, wherein a direction of the bias magnetic field is parallel to a direction of magnetic polarization formed when the alkaline metal atom is optically pumped by the pump light.

14. The method of claim 11, wherein the detecting of the magnetic signal comprises measuring a polarization rotation angle of the atomic magnetometer using a balanced polarimeter.

15. The method of claim 1, wherein the detecting of the phase signal of the magnetic field comprises:
generating a difference between the magnetic signal and a reference signal or a sum signal of the magnetic signal and the reference signal by mixing the inputted magnetic signal and the reference signal;
filtering out a particular frequency from the difference between the magnetic signal and the reference signal or the sum signal using a low-pass filter;
analyzing a phase and a size of a vector of the filtered signal; and
outputting two voltage values as the phase signal depending on an analysis result.

16. The method of claim 12, wherein the vapor cell further comprises a quenching gas configured to improve optical pumping efficiency.

* * * * *